(12) United States Patent
Bhupendra et al.

(10) Patent No.: US 8,445,889 B2
(45) Date of Patent: May 21, 2013

(54) METHOD OF PATTERNING OF NANOSTRUCTURES

(75) Inventors: Kumar Bhupendra, San Diego, CA (US); Yuanyuan Zhang, Singapore (SG); Zongbin Wang, Singapore (SG); Lain-Jong Li, Singapore (SG); Subodh Gautam Mhaisalkar, Singapore (SG)

(73) Assignee: Nanyang Technological University, Singapore (SG)

( * ) Notice: Subject to any disclaimer, the term of this patent is extended or adjusted under 35 U.S.C. 154(b) by 169 days.

(21) Appl. No.: 12/918,842

(22) PCT Filed: Feb. 23, 2009

(86) PCT No.: PCT/SG2009/000064
§ 371 (c)(1),
(2), (4) Date: Aug. 23, 2010

(87) PCT Pub. No.: WO2009/105045
PCT Pub. Date: Aug. 27, 2009

(65) Prior Publication Data
US 2011/0001118 A1 Jan. 6, 2011

Related U.S. Application Data

(60) Provisional application No. 61/030,762, filed on Feb. 22, 2008.

(51) Int. Cl.
*H01L 29/06* (2006.01)

(52) U.S. Cl.
USPC ............... 257/9; 257/E29.245; 438/758

(58) Field of Classification Search
USPC ............ 438/758; 257/9, E29.245; 156/249
See application file for complete search history.

(56) References Cited

U.S. PATENT DOCUMENTS

| | | | |
|---|---|---|---|
| 8,129,494 B2 * | 3/2012 | Shimizu | 528/196 |
| 2004/0063809 A1 * | 4/2004 | Fu et al. | 523/160 |
| 2007/0065977 A1 * | 3/2007 | Rinzler et al. | 438/99 |
| 2007/0153353 A1 * | 7/2007 | Gruner | 359/245 |

FOREIGN PATENT DOCUMENTS

| | | |
|---|---|---|
| WO | WO 01/21863 A1 | 3/2001 |
| WO | WO 2007/120877 A2 | 10/2007 |
| WO | WO 2009/000969 A1 | 12/2008 |

* cited by examiner

*Primary Examiner* — Phuc Dang
(74) *Attorney, Agent, or Firm* — Dickstein Shapiro LLP

(57) ABSTRACT

A method of patterning nanostructures comprising printing an ink comprising the nanostructures onto a solvent-extracting first surface such that a pattern of nanostructures is formed on the first surface.

22 Claims, 14 Drawing Sheets

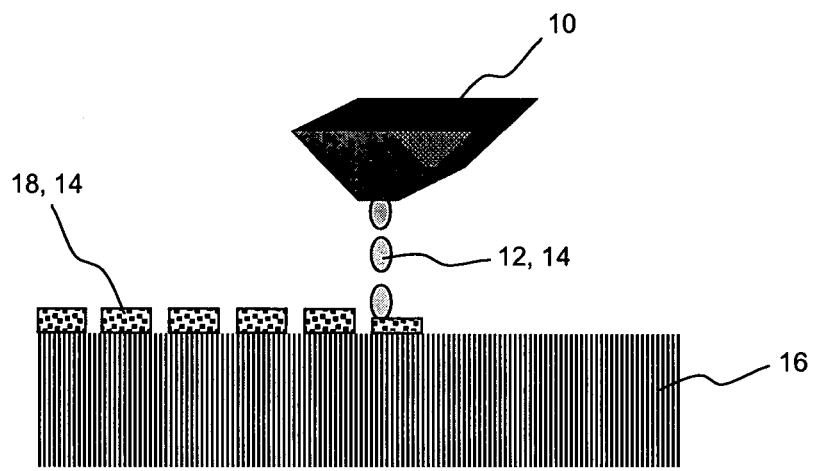
FIG. 1B (i)
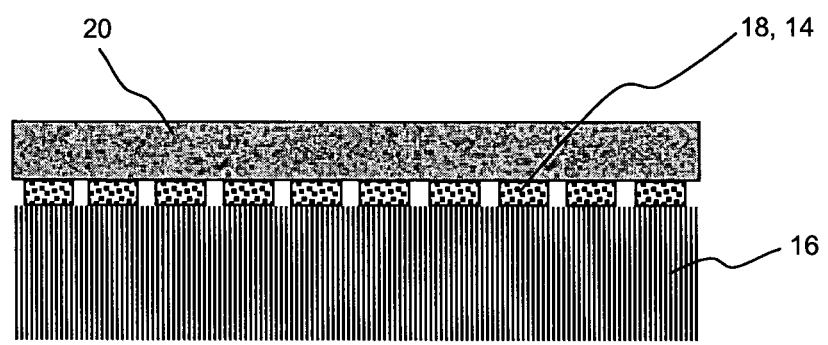
FIG. 1B (ii)
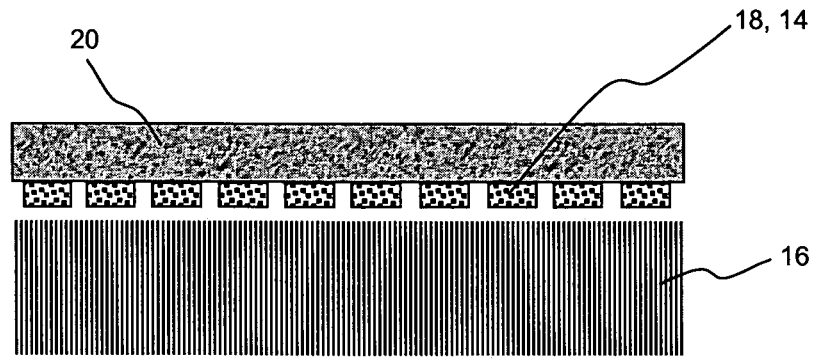
FIG. 1B (iii)

FIG. 1B (iv)

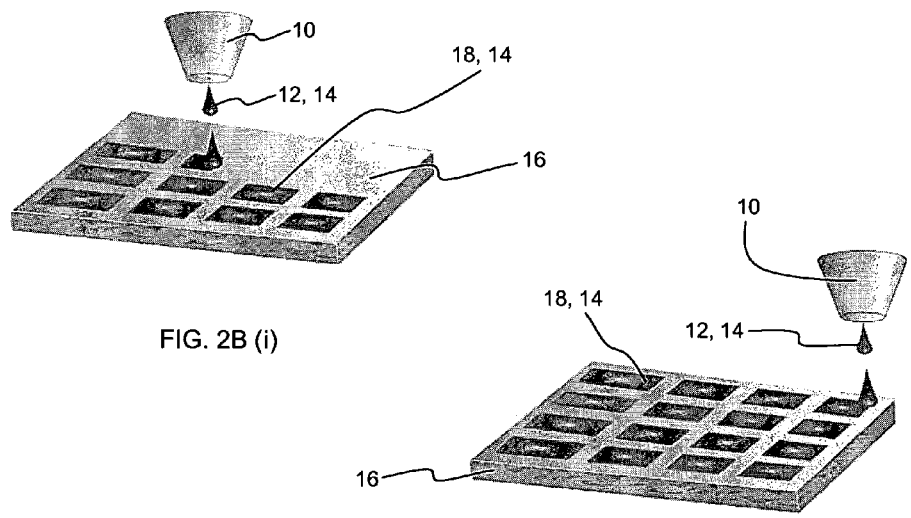
FIG. 2B (i)
FIG. 2B (ii)
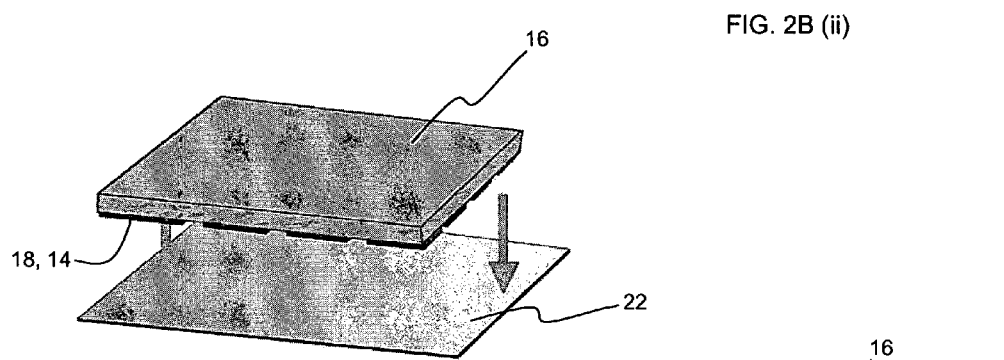
FIG. 2B (iii)
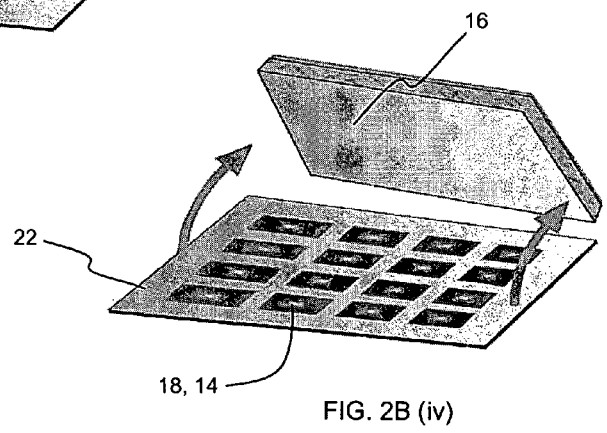
FIG. 2B (iv)

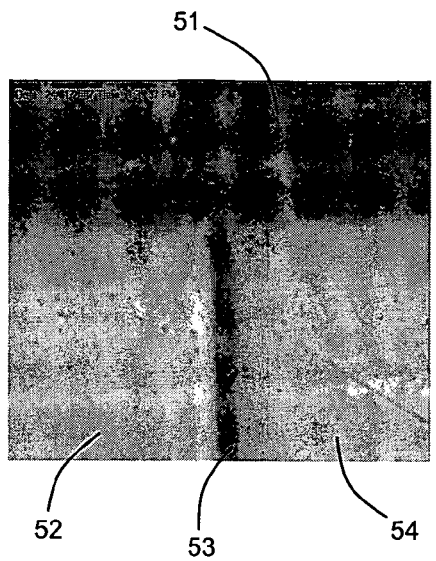
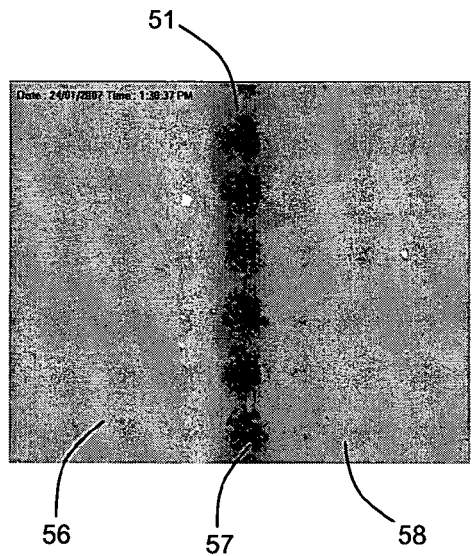
FIG. 5(a)　　　　　　　　　FIG. 5(b)
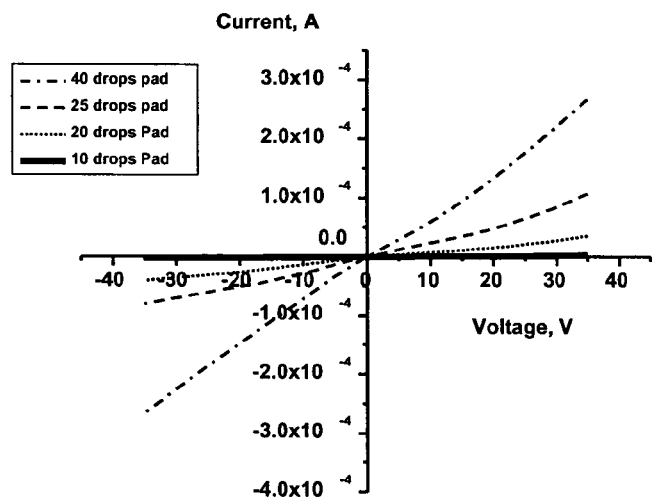
FIG. 6
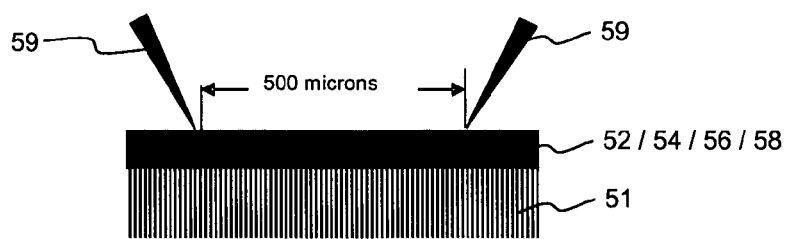
FIG. 7

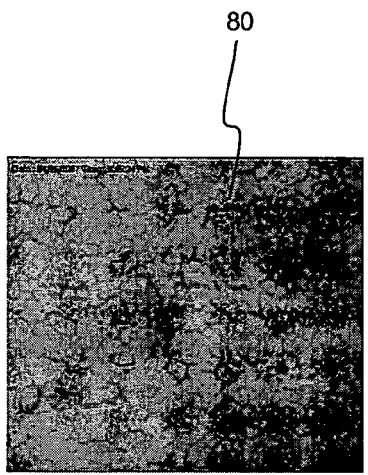
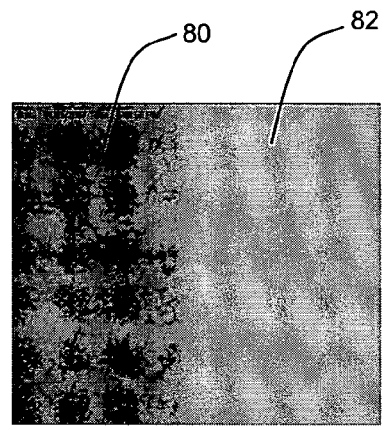
FIG. 8(a)　　　　　　　　　　FIG. 8(b)
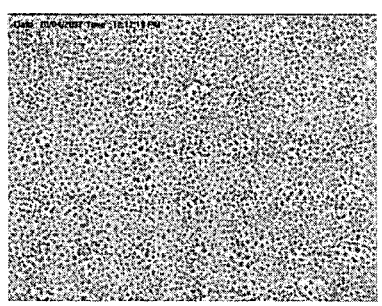
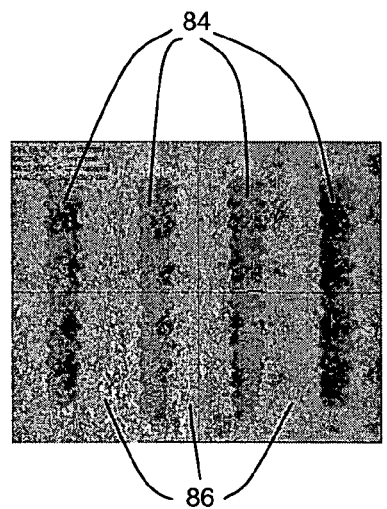
FIG. 8(c)　　　　　　　　　　FIG. 8(d)

METHOD OF PATTERNING OF NANOSTRUCTURES

This application claims the benefit of U.S. Provisional Application No. 61/030,762, filed on Feb. 22, 2008.

REFERENCE TO RELATED APPLICATIONS

This is a 371 of International Application No. PCT/SG09/00064, filed on Feb. 23, 2009.

Reference is made to our earlier U.S. provisional patent application No. 61/030,762 filed Feb. 22, 2008 for an invention titled "Ink jet and Transfer Printing of Electronic Circuits" the priority of which is hereby claimed, and the contents of which are hereby incorporated by reference as if disclosed herein in their entirety.

Reference is also made to our earlier U.S. patent application Ser. No. 12/302,155 filed Nov. 24, 2008 for an invention titled "Solution Processed Inorganic films for Organic Thin Film Transistors" the contents of which are hereby incorporated by reference as if disclosed herein in their entirety.

TECHNICAL FIELD

This invention relates to patterning and microarray patterning of nanostructured materials and biological molecules on various substrates and particularly, though not exclusively, relates to thin-film transistors ("TFT"s) and circuits comprising such nanostructures.

BACKGROUND

Nanostructures have been extensively explored for use in gas/chemical/biological sensors, active and passive components for electronic devices, and many other applications. However, synthesis of nanostructures typically requires high temperatures and vacuum environments. Furthermore, most applications involving nanostructures require well-aligned patterns and/or micro arrays. Fabrication of such patterns and micro/nano patterned films also currently require a clean room environment and involve several lithography steps.

For example, a conventional patterned nanostructure-on-substrate fabrication method involves first vacuum filtration of a solution of nanostructured materials with filter paper so that the nanostructures are left on the filter paper. A planar stamp is then brought into conformal contact with the nanostructures on the filter paper so that the nanostructures on the filter paper are transferred to the planar stamp. The planar stamp having the nanostructures is then brought into conformal contact with a desired substrate to transfer the nanostructures from the planar stamp onto the desired substrate. A photo resist pattern is then formed on the nanostructures on the substrate using a photolithography process. Nanostructures not masked by the photo resist pattern are then etched away by a dry or wet etching process. The photo resist pattern is then removed from the nanostructures. Device and circuitry fabrication can then take place using the substrate carrying the patterned nanostructures.

In another conventional fabrication method, instead of using a planar stamp, a patterned stamp is provided to transfer the nanostructures from the filter paper to the desired substrate so that only a pattern of nanostructures is removed from the filter paper and transferred onto the substrate. Although photolithography is not required on the nanostructures after their transfer onto the substrate, photolithography is still required to form the pattern on the patterned stamp. Making the patterned stamp involves first fabricating a master mould. The master mould may be of silicon and made by developing a photo resist pattern on a surface of a silicon substrate using a standard photolithography process. The silicon substrate is then etched with the photo resist pattern acting as a mask, followed by removal of the photo resist mask from the silicon substrate to form a patterned silicon mould. The patterned silicon mould then undergoes surface treatment to facilitate stamp removal. Soft stamp material such as a polydimethylsiloxane (PDMS) is then poured or spin coated in liquid form onto the master mould to form the patterned stamp. Alternatively, metal or polymer moulds may be used, requiring processes such as precision cutting, grinding and polishing to achieve the desired pattern. Such processes are time consuming and labour intensive.

SUMMARY

A method is provided using printing to form patterns of nanostructures. The method is especially applicable for inks having a low concentration of nanostructures, inks with low viscosity, or inks that are aqueous in nature, where spreading of the ink solvent results in formation of bridges with adjacent circuits that affect manufacturability of circuits. The method comprises fewer steps than conventional methods of forming nanostructure patterns, eliminating the need for lithography either to pattern the nanostructures or to fabricate a patterned master mould. Being solution processable, the method is also comparatively more cost effective.

The method is equally applicable to aqueous or organic solution-based inks, and may be adapted to any appropriate printing set-up such as ink jet printing, spray printing through a mask, screenprinting, electrojet printing and so forth. The method is particularly suitable for low solubility and low-viscosity dispersions of nanostructures, offering a solution to printing challenges such as uneven solvent evaporation, solvent spreading and the consequent ring or coffee stain effect where the nanostructures are pulled outwardly towards the periphery of the printing spot as the solvent spreads and evaporates. Use of printing renders the method highly scalable.

Printing on porous surfaces such as substrates and stamps facilitates pattern integrity as well as better control of the concentration of nanostructures in the printed patterns, avoiding problems of pattern deformation due to low viscosity and solubility of the nanostructures in the ink. Printing in conjugation with transfer printing also provides flexibility in fabrication that may be used for large scale as well as small scale fabrication without requiring substantial set-up modifications. In addition, different patterns may be readily printed without requiring separate masks or master moulds to be fabricated as would be necessary in conventional techniques.

According to a first exemplary aspect, there is provided a method of patterning nanostructures comprising printing an ink comprising the nanostructures onto a solvent-extracting first surface such that a pattern of nanostructures is formed on the first surface.

The transfer printing preferably comprises the steps of conformally contacting a stamp with the first surface such that the pattern of nanostructures on the first surface is transferred onto the stamp; and conformally contacting the stamp with the second surface so that the pattern of nanostructures on the stamp is transferred onto the second surface. The stamp is preferably a planar PDMS stamp.

Alternatively, the first surface may be a stamp and the transfer printing comprises conformally contacting the stamp with the second surface so that the pattern of nanostructures on the stamp is transferred onto the second surface. The first surface is preferably a planar agarose stamp.

For all embodiments, the solvent-extracting first surface is at least one of: porous, absorbent and adsorbent. The first surface may have a sorptive capacity of at least 0.01 mL/g (intrinsic) and 0.1 mL/m2 (extrinsic). The first surface is preferably at least one of: rigid, flexible, an alumina filter, a dielectric film, a conducting film, photo paper, agarose, a sol gel substrate, a silicon substrate, a PET substrate, and a PDMS substrate. Alternatively, the first surface may be a patterned substrate consisting of: a material having patterned conducting wires, a dielectric film embedded with conducting structures, a composite film, a composite material comprising dielectrics and conducting structures exposed by a process selected from: chemical-mechanical polishing and etching-back.

The second surface may be selected from: rigid, flexible, a conducting film, a dielectric film, a PET substrate, a glass substrate, a silicon substrate, a quartz substrate, and a metal foil. Alternatively, the second surface may be a patterned substrate selected from but not limited to: a material having patterned conducting wires, a dielectric film embedded with conducting structures, a composite film, a composite material comprising dielectrics and conducting structures exposed by a process selected from: chemical-mechanical polishing and etching-back.

The nanostructures may comprise at least one selected from: carbon nanotubes, metal nanoparticles, a metal oxide material, a semiconducting material, polymer particles, crystalline particles, amorphous particles, organic particles, inorganic particles, rods, fibres, needles, plates, whiskers, biological molecules, proteins, and biofunctionalized particles. The nanostructures may be crystalline polymer particles for promoting self-alignment of the nanostructures. The nanostructures may also be modified for at least one purpose selected from the group consisting of: facilitating ink formulation and providing additional functionality.

The ink preferably comprises nanostructures homogenously dissolved in a solvent preferably being at least one selected from: single organic, multiple organic, polar, nonpolar, and water. The ink may further comprise additional material selected from: organic and inorganic. The additional material may be removed from the pattern of nanostructures to obtain a pattern of pure nanostructures by a process preferably selected from: annealing, laser burning, and dissolving in a solvent. The ink preferably has a form selected from: a suspension, a multiphase mixture, a micellar structure, a copolymer, and a colloid.

All embodiments of the method may be performed at a temperature ranging between 0° C. to 225° C., preferably between 30° C. to 225° C.

The printing may be selected from: ink jet printing, spray printing through a mask, screen printing and electrojet printing According to another exemplary aspect, there is provided a thin film transistor having an active layer, wherein the active layer comprises the pattern of nanostructures formed by the method given above, and wherein the pattern of nanostructures is used for applications selected from but not limited to the group consisting of: interconnect applications having resistivity ranging from 10-10 Ω/cm to 1010 Ω/cm, supercapacitors, batteries, conducting electrodes and transparent electrodes.

BRIEF DESCRIPTION OF THE DRAWINGS

In order that the invention may be fully understood and readily put into practical effect there shall now be described by way of non-limitative example only exemplary embodiments of the present invention, the description being with reference to the accompanying illustrative drawings.

In the drawings:

FIGS. 2B (i) to (iv) are a schematic illustration of the other exemplary method of FIG. 2A;

FIGS. 5(a) and (b) are optical images of nanostructure patterns on alumina filters FIG. 6 is a graph of I-V curves for different single walled carbon nanotube (SWCNT) films;

FIG. 7 is a schematic illustration of the measurement set-up to obtain the graph of FIG. 6;

FIG. 8(a) to (d) are optical images of nanostructure patterns on porous substrates;

DETAILED DESCRIPTION OF THE EXEMPLARY EMBODIMENTS

Figure 1A:
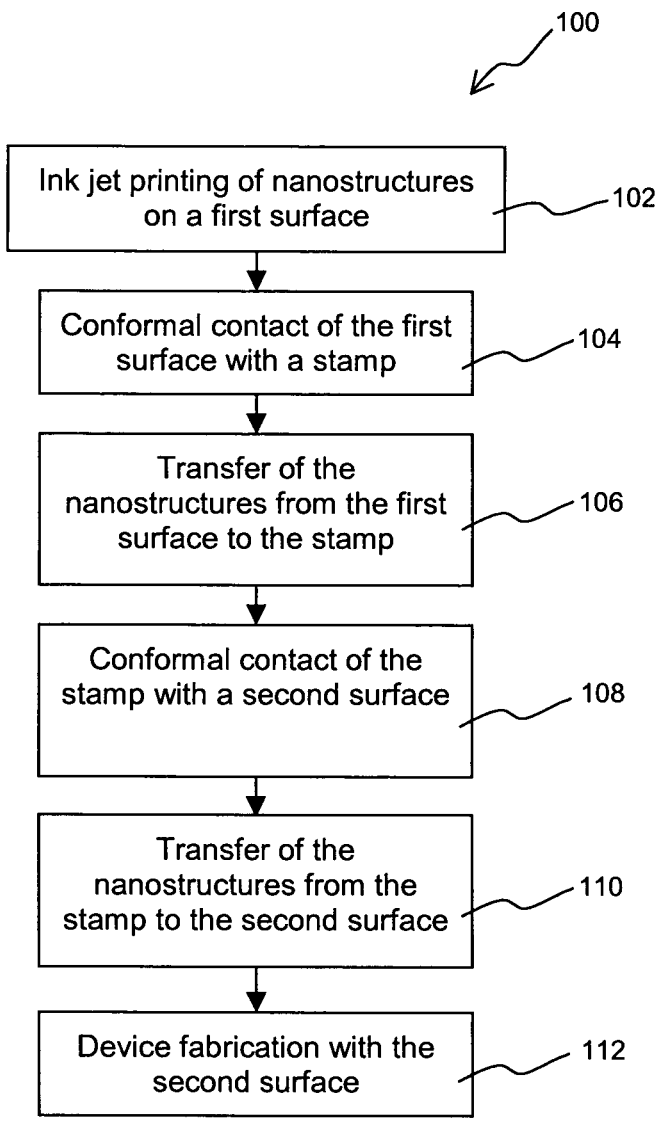
FIG. 1A is a flowchart of an exemplary method of patterning nanostructures.
Figure 1B:
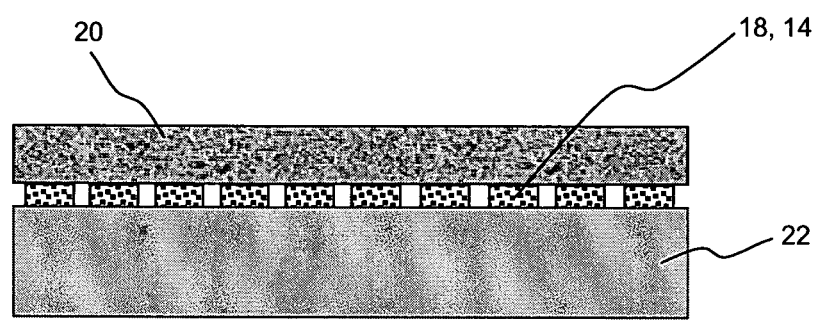
FIGS. 1B (i) to (v) are a schematic illustration of the exemplary method of FIG. 1A.
Figure 1B:
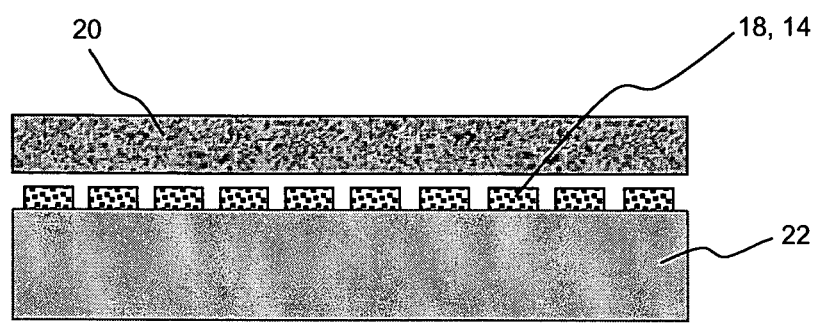

A first exemplary embodiment of the method of patterning nanostructures on a substrate is shown in FIG. 1A and FIGS. 1B (i) to 1B (v). The exemplary method 100 comprises a step 102 of using an ink jet printer 10 to print an ink 12 comprising a dispersion of nanostructures 14 in a solvent. The ink 12 is printed onto a solvent-extracting first surface 16 or substrate 16 such that a pattern 18 of nanostructures 14 is formed on the first surface 16 (FIG. 1B (i)). Solvent-extracting may be by sorption or by being porous thus enabling the solvent to pass through. As defined in ASTM specification Designation: D 6651-01, sorption is a process in which liquid molecules are taken up either by absorption or adsorption, or both.

In the first exemplary embodiment, the first surface 16 is preferably a commercially available porous filter paper, such as Whatman® alumina filter paper having pore sizes ranging from 0.2 microns to 0.02 microns. Being porous, the filter paper is able to extract the solvent in the printed ink 12 to prevent the solvent spreading on the first surface 16. In this way, well defined patterns 18 of the nanostructures 14 may be left on the surface 16 after the solvent has been absorbed by the filter paper. Pore size of the filter paper to be used is selected according to particle size of the nanostructures 14 in the ink 12.

A stamp 20, preferably a Polydimethysiloxane (PDMS) planar stamp, is then brought into conformal contact with the first surface 16, 104 (FIG. 1B (ii)) such that the pattern 18 of nanostructures 14 on the first surface 16 is transferred from the first surface 16 onto the stamp 20, 106 (FIG. 1B (iii)). This can take place because the pattern 18 of nanostructures 14 sits loosely on the porous filter paper 16. The porous filter paper 16 may then be discarded. In this embodiment, the pattern 18 is a micropattern 18.

Subsequently, the stamp 20 is brought into conformal contact with a second surface 22, 108 (FIG. 1B (iv)) such that the micropattern 18 of nanostructures 14 on the stamp 20 is transferred from the stamp 20 onto the second surface 22, 110 (FIG. 1B (v)). In this way, the micropattern 18 of nanostructures 14 is transfer printed from the filter paper first surface 16 onto the second surface 22.

Device fabrication 112 can then be performed with the second surface 22 substrate using conventional fabrication techniques for various uses such as interconnect applications having resistivity ranging from 10-10 $\Omega$/cm to 1010 $\Omega$/cm, as supercapacitors, batteries, conducting electrodes or transparent electrodes.

Figure 2A:
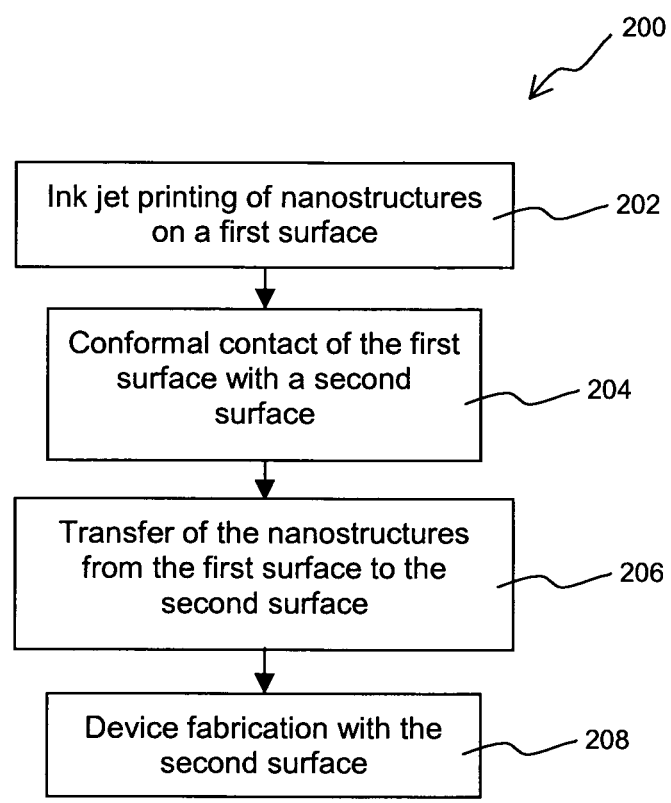
FIG. 2A is a flowchart of another exemplary method of patterning nanostructures.

A second exemplary embodiment of the method of patterning nanostructures on a substrate is shown in FIG. 2A and FIGS. 2B (i) to 2B (iv). The exemplary method 200 comprises a step 202 of using the ink jet printer 10 to print the ink 12 comprising nanostructures 14 onto the solvent-extracting first surface 16 (FIG. 2B (i)) such that the pattern 18 of nanostructures 14 is formed on the first surface 16 (FIG. 2B (ii)).

In the second exemplary embodiment, the first surface 16 may be a porous planar agarose stamp. For example, the porous planar agarose stamp 16 may be an agarose gel thick film having a composition of 2% w/v in aqueous solution if high strength agarose is used. Alternatively, if a low-melting point agarose is used, the agarose gel thick film composition may be 5% w/v in aqueous solution. Where the nanostructures 14 to be printed comprise biomolecules, the agarose gel film preferably comprises a buffer solution with a pH value of around 7 instead of an aqueous solution. During printing, a glass slide is preferably used as a backing for the porous planar agarose stamp 16, with the agarose gel film thickness preferably maintained at a thickness of 3 mm.

After printing of the pattern 18 of nanostructures 14, the porous planar agarose stamp 16 is then brought into conformal contact with the second surface 22, 204 (FIG. 2B (iii)) such that the pattern 18 of nanostructures 14 printed on the porous planar agarose stamp 16 is transferred from the porous planar agarose stamp 16 onto the second surface 22, 206 (FIG. 2B (iv)). In this way, the pattern 18 of nanostructures 14 is transfer printed from the planar agarose first surface 16 onto the second surface 22. Similarly, device fabrication 208 can then be performed with the second surface 22 substrate.

For both embodiments, the second surface 22 is preferably a non-porous substrate that may be rigid or flexible. For example, the second surface 22 substrate could be a conducting film, a dielectric film, a PET substrate, a glass substrate, a silicon substrate, a quartz substrate, or a metal foil.

Depending on the desired application or device to be formed, other than filter paper or agarose, the first surface 16 may also be one or more of a dielectric film, a conducting film, photographic paper, a sol gel substrate, a silicon substrate, a PET substrate, and a PDMS substrate. The first surface may even be a patterned substrate comprising a material having patterned conducting wires, a dielectric film embedded with conducting structures, a composite film, or a composite material comprising dielectrics and conducting structures exposed by chemical-mechanical polishing or etching-back. Similarly, the second surface may be a patterned substrate comprising a material having patterned conducting wires, a dielectric film embedded with conducting structures, a composite film, or a composite material comprising dielectrics and conducting structures exposed by chemical-mechanical polishing or etching-back.

The first surface or substrate 16 on which the nanostructures 14 are printed should be able to extract the solvent in the printed ink 12 to prevent excessive spreading of the solvent on the first surface 16. This is to facilitate retention of pattern integrity of the nanostructures 14 that are left on the first surface 16 when the solvent has been extracted. A solvent-extracting surface also allows for better control of the concentration of nanostructures in the patterns formed on the surface or substrate.

Sorptive capacity of the first surface or substrate 16 is preferably at least 0.01 mL/g (intrinsic) and 0.1 mL/m2 (extrinsic). As defined in ASTM specification Designation: D 6651-01, sorptive capacity refers to the maximum amount of liquid absorbed and/or adsorbed under specified conditions. Intrinsic rate of sorption is the rate at which a specified liquid is sorbed on a per-unit-mass basis under specified conditions. Extrinsic rate of sorption is the rate at which a specified liquid is sorbed on a per-unit-area basis under specified conditions.

The nanostructures 14 comprised in the ink 12 may take the form of carbon nanotubes, metal nanoparticles, metal oxide materials, semiconducting materials, polymer particles, crystalline particles, amorphous particles, organic particles, inorganic particles, rods, fibres, needles, plates, whiskers, biological molecules, proteins, biofunctionalized particles, or other nano-sized forms. Crystalline polymer nanoparticles are preferably used for promoting self-alignment of the nanostructures when ink jet printing patterns of nanostructures on a patterned substrate. The nanostructures 14 may also be modified in order to facilitate ink formulation and to provide additional functionality for devices subsequently made using the printed nanostructure patterns. For example, the surface of the nanostructures 14 is preferably functionalized to achieve good dispersion of the nanostructures 14 in the solvent and prevent agglomeration. This helps to maintain a consistent density of nanostructures 14 for each print spot during ink jet printing with the ink 12.

To formulate the ink 12, the nanostructures 14 are preferably homogenously dissolved in a solvent. The solvent may be single organic, multiple organic, polar, non-polar, or water. The ink 12 may further comprise additional organic or inorganic material. The additional material may subsequently be removed from the printed pattern of nanostructures in order to obtain a pattern of pure nanostructures by processes such as annealing, laser burning, or dissolving in a solvent.

Figure 3A:
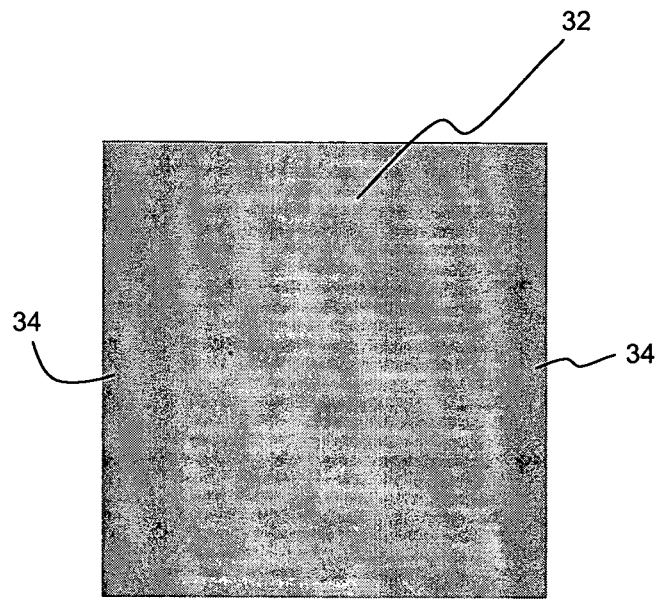
FIGS. 3(a) and (b) are optical images of nanostructure patterns on a substrate prepared by the exemplary method of FIGS. 2A and 2B.
Figure 3B:
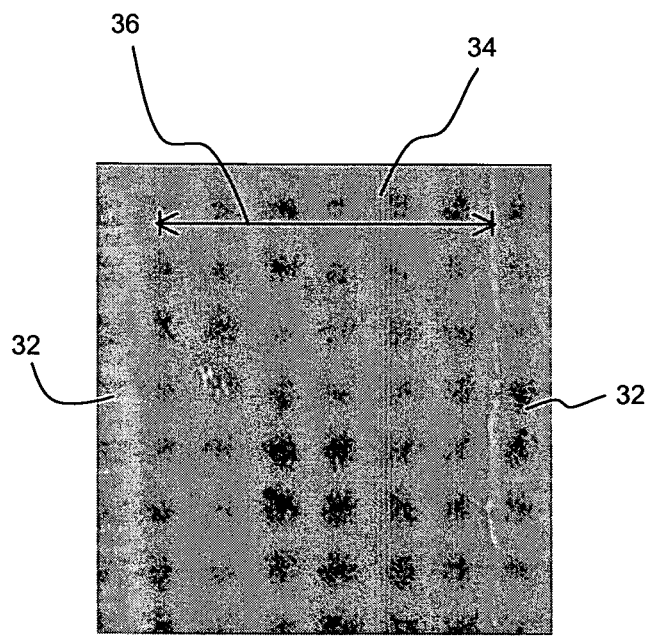

The ink 12 may take the form of a suspension, a multiphase mixture, a micellar structure, a copolymer, or a colloid. Ink jet printing is preferably performed at a temperature ranging between 0° C. to 225° C., more preferably between 30° C. to 225° C. FIGS. 3(a) and (b) show 1×1 mm2 patterns of single walled carbon nanotubes 32 on an SiO2/Si substrate 34 with a 1 mm gap 36 therebetween, prepared by the second exemplary method described above. A 3 mm think agarose gel film was used as the porous planar agarose stamp, made by mixing high strength agarose in deionized water at 2% w/v.

FIGS. 4 (a) to (d) show schematic illustrations of exemplary device structures comprising a porous dielectric layer or substrate and having ink jet printed semiconducting nanostructures thereon. The same reference numerals have been used to denote similar structures among the devices.

Figure 4A:
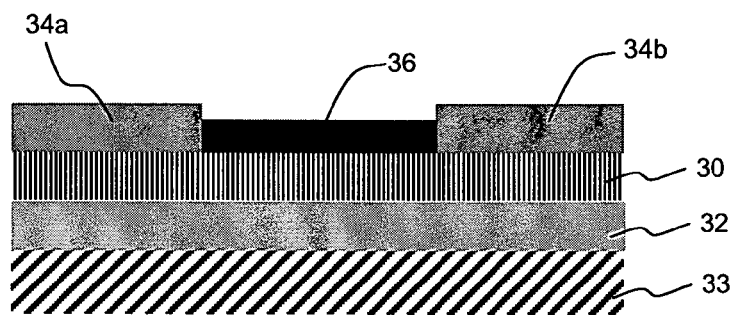
FIGS. 4(a) to (d) are schematic illustrations of exemplary device structures comprising a porous dielectric layer or substrate.

The device shown in FIG. 4(a) has a bottom gate and top contact configuration. It comprises two dielectric layers: a porous 30 top dielectric layer and a non-porous 32 bottom dielectric layer on a silicon substrate 33. The porous 30 top dielectric layer is preferably deposited using a sol-gel method whereas the non-porous 32 bottom dielectric layer may be deposited using a sol-gel method as described in U.S. patent application Ser. No. 12/302,155 or by physical deposition. The top contacts 34a, 34b are first deposited by ink jet printing or a standard lithography process. Semiconducting nanostructures 36 may then be deposited by ink jet printing an ink comprising the semiconducting nanostructures 36 onto the porous 30 top dielectric layer between the top contacts 34a, 34b, in a similar manner as the pattern 18 of nanostructures 14 is printed on the filter paper 16 as described in the first exemplary embodiment.

Figure 4B:
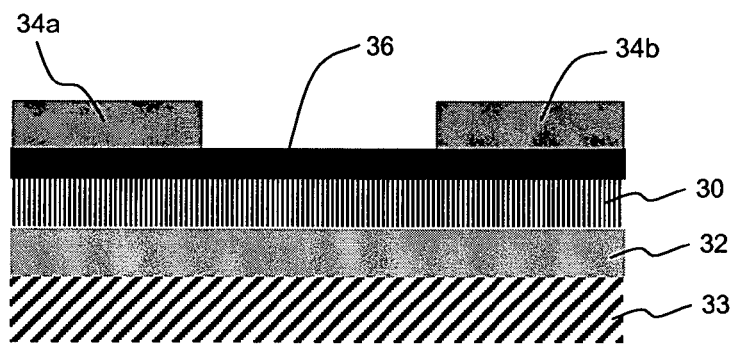

FIG. 4(b) shows a similar device as FIG. 4(a), having a bottom gate and top contact configuration with a porous 30 top dielectric layer and a non-porous 32 bottom dielectric layer deposited on a silicon substrate 33 in similar ways as the device of FIG. 4(a). For the device of FIG. 4(b), the semiconducting nanostructures 16 are first ink jet printed onto the porous 30 top dielectric layer, before deposition of the source and drain contacts 34a, 34b by ink jet printing or a standard lithography process.

Figure 4C:
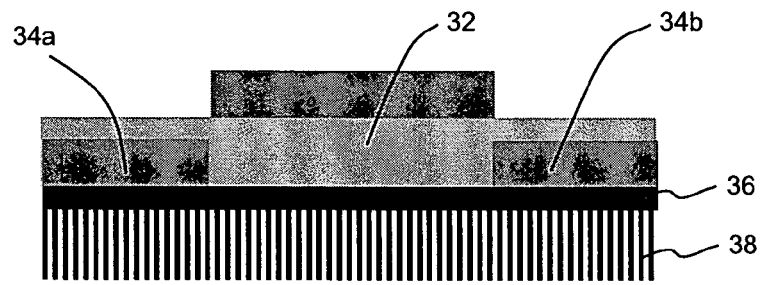

The device shown in FIG. 4(c) has a top gate top contact configuration. The substrate 38 used in this configuration is porous to facilitate ink jet printing of the semiconducting nanostructures 36 thereon before depositing the contacts 34a, 34b by ink jet printing or a standard lithography process.

Figure 4D:
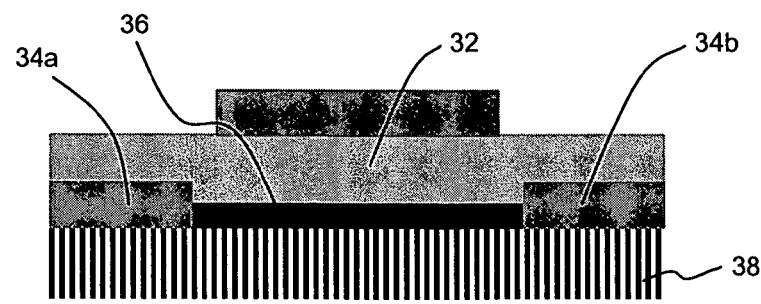

The device shown in FIG. 4(d) has a top gate configuration wherein the contacts 34a, 34b are first defined by ink jet printing or a standard lithography process before ink jet printing of the semiconducting nanostructures 36. Like the device of FIG. 4(c), the substrate 38 used in this configuration is porous to facilitate ink jet printing of the semiconducting nanostructures 36 thereon.

In alternative embodiments, the dielectric layers described above may be solution processed, and made of composite and/or organic materials.

FIGS. 5(a) and (b) show alumina filter papers 51 ink jet printed with ink comprising nanostructures 14 in the form of single walled carbon nanotubes (SWCNT). The printed nanostructure pattern in FIG. 5(a) comprises two 3×3 mm2 pads 52, 54 having a 100 micron separation 53 therebetween, while FIG. 5(b) comprises two 3×3 mm2 pads 56, 58 having a 65 micron separation 57 therebetween. Both patterns in FIGS. 5(a) and (b) were formed by printing over each pad 52, 54, 56, 58 sixty times, i.e., printing with 60 drops of ink at each pad location, and have a resistance of about 500 kΩ. It was found that resistance of the printed patterns decreases when the number of drops printed at each location increases, as shown in FIG. 6. As the number of drops increased from 10 to 40, resistance of the printed pads decreased 10-fold. This is due to the higher concentration of the conducting SWCNT present in the pads that are printed over more times, making such pads more conductive. FIG. 7 shows an exemplary measurement set-up used to obtain the I-V curves of FIG. 6, wherein microprobes 59 were placed 500 microns apart on each pad 52, 54, 56, 58.

Further examples of ink jet printed nanostructure patterns are shown in FIGS. 8(a) to (d). FIGS. 8(a) and (b) show 5×5 mm2 SWCNT patterns 80 printed on photographic paper 82, having a resistance of around 100 kΩ. FIG. 8(c) shows uniformly distributed pores on a surface of a porous TiO2/SiO2/Si substrate. FIG. 8(d) shows ink jet printed 0.125×1 mm2 SWCNT patterns 84 with 500 micron separations 86 on the porous TiO2/SiO2/Si substrate of FIG. 8(c). The substrate shown in FIGS. 8(c) and 8(d) comprises a porous 120 nm thick TiO2 thin film on a 100 nm thick SiO2 film. This is prepared using a sol gel method, wherein the sol gel solution is prepared by mixing 2.5 ml of titanium isopropoxide with 25 ml of ethanol, followed by drop-by-drop addition of a solution of 0.13 ml of 60% HCl in 0.16 ml of water to form a resultant solution that is aged for three hours on a magnetic stirrer.

Figure 9A:
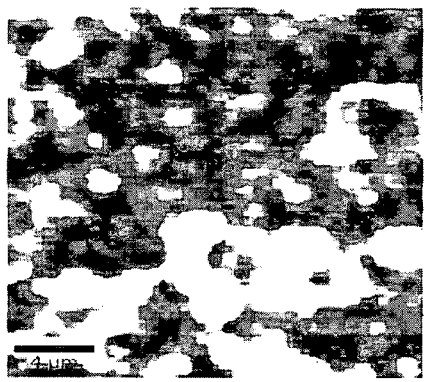
FIG. 9A is a 2D Raman spectroscopy image of an ink-jet printed SWCNT pattern.
Figure 9B:
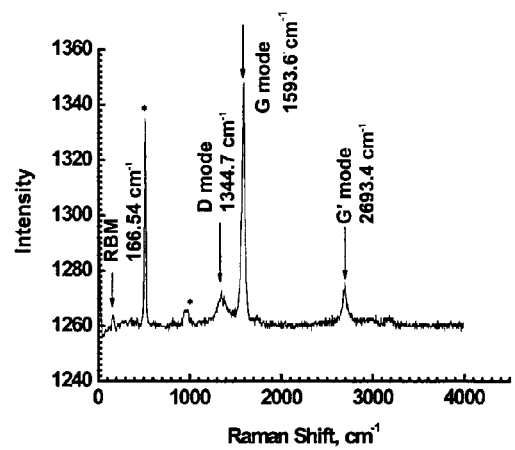
FIG. 9B is a Raman spectrum for the SWCNT pattern of FIG. 9A.

Presence of the SWCNT on the porous TiO2/SiO2/Si substrate was determined using Raman spectroscopy with a 633 nm wavelength laser. FIG. 9A shows a 2D Raman spectroscopy image of a SCWN pattern that was ink jet printed onto a porous TiO2/SiO2/Si substrate. Presence of RBM (166.5 cm−1), D mode (1344.7 cm−1), G mode (1593.6 cm−1) and G' mode (2693.4 cm−1) as shown in the Raman spectrum of FIG. 9B confirms the presence of the SWCNT on the porous TiO2/SiO2/Si substrate.

Figure 10A:
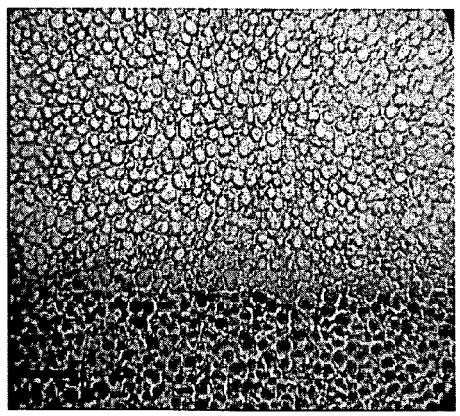
FIG. 10A is an optical image of a channel area of a bottom gate and top gold contact field effect transistor device.
Figure 10B:
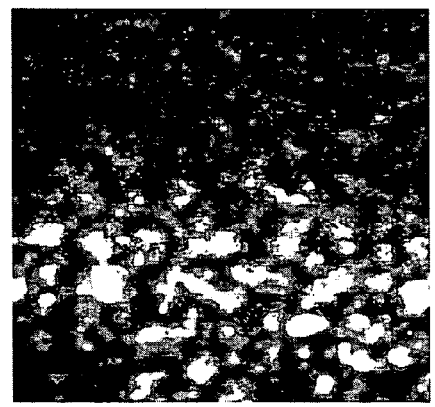
FIG. 10B is a 2D Raman spectroscopy image of the channel area of FIG. 10A.

FIGS. 10A and 10B show an optical image and corresponding 2D Raman spectroscopy image of a channel area of a bottom gate and top gold contact field effect transistor device respectively.

Figure 11A:
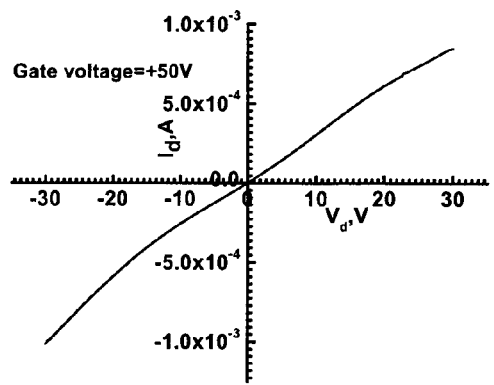
FIG. 11A is an Id-Vd curve of a field effect transistor with SWCNT as a channel before continuous Vsd sweeps.
Figure 11B:
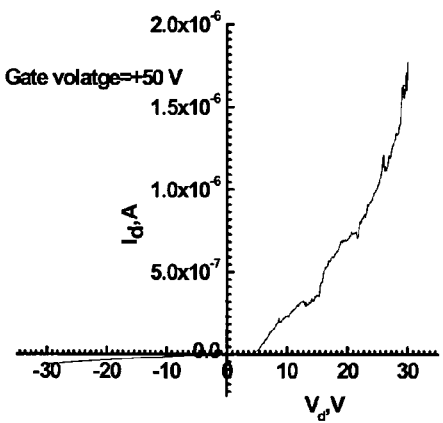
FIG. 11B an Id-Vd curve of the field effect transistor of FIG. 11A after continuous Vsd sweeps.
Figure 11C:
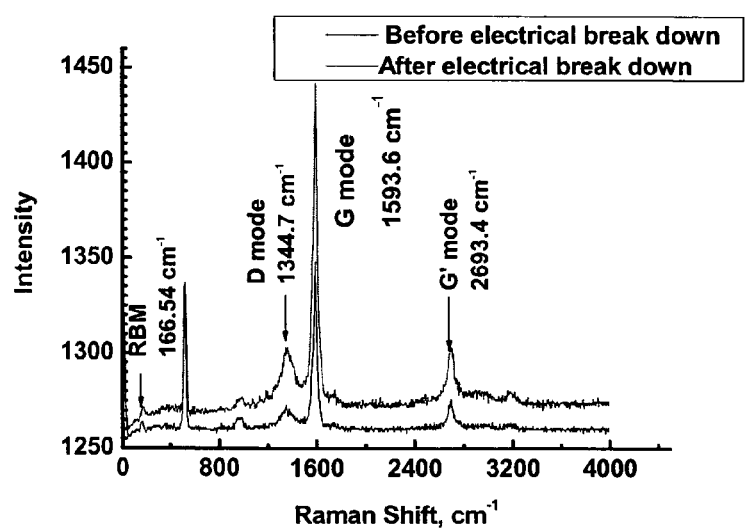
FIG. 11C is a Raman spectra for before and after electrical break down.

Metallic behaviour was exhibited by all examples of nanostructure patterns printed with a high density of conductive nanostructures 14 such as SWCNT. Electrical break down was carried out at Vg=+50V with Vsd sweeps from −30V to +30V. Ohmic nature of Id-Vd as shown in FIG. 6 changed to Schottky diode behaviour after a few continuous Vsd sweeps as shown in FIGS. 11A (before Vsd sweeps) and 11B (after Vsd sweeps). However, no change was observed in the Raman spectra before and after the electrical break, as shown in FIG. 11C, thereby confirming presence of the carbon nanotubes in the ink jet printed patterns.

Figure 12A:
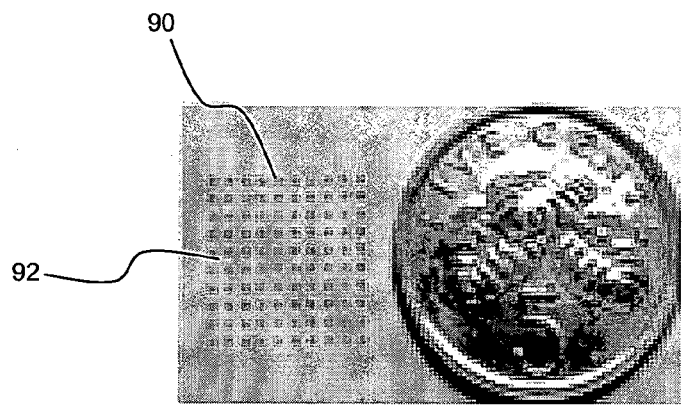
FIGS. 12A and 12B are photographic images of SWCNT patterns.
Figure 12B:
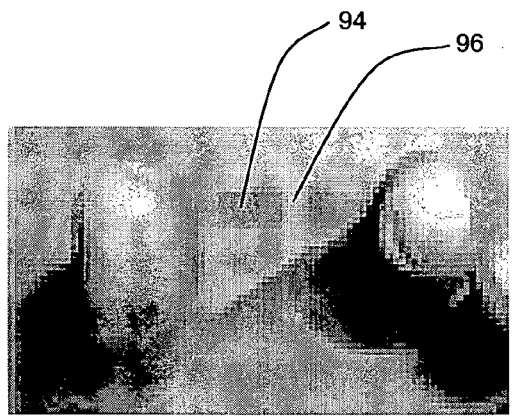

FIGS. 12A and 12B show more examples of ink jet printed SWCNT patterns. The pattern in FIG. 12A is a 10×10 array of 0.5×0.5 mm2 SWCNT pads 90 having 0.5 mm separations 92 between pads, while FIG. 12B shows a pattern of two 20×10 mm2 SWCNT pads 94 with 5 mm separation 96 between pads.

Figure 13:
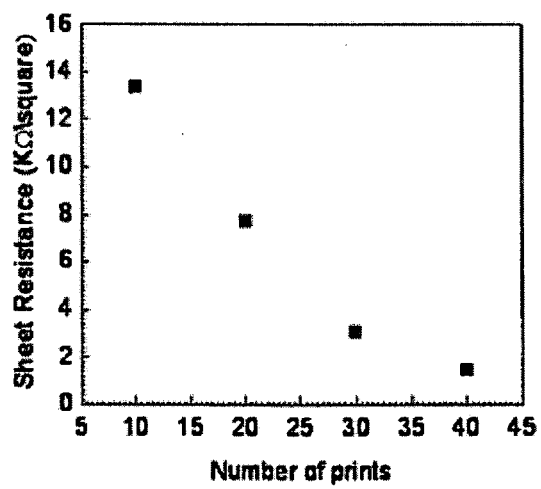
FIG. 13 is a graph of sheet resistance vs number of prints for a SWCNT pattern.
Figure 14:
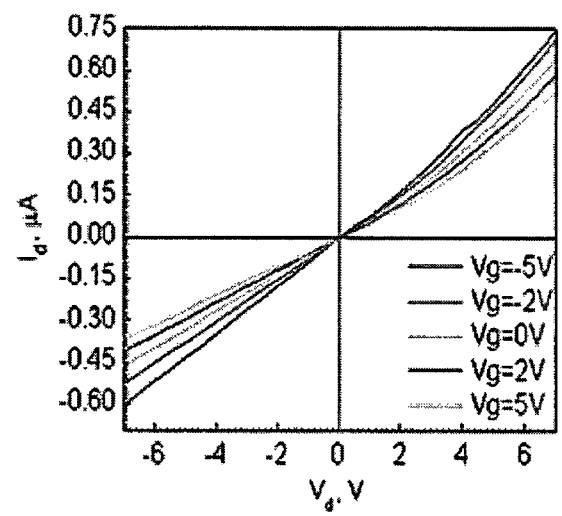
FIG. 14 is a graph of gate dependence of SWCNT network channels.
Figure 15:
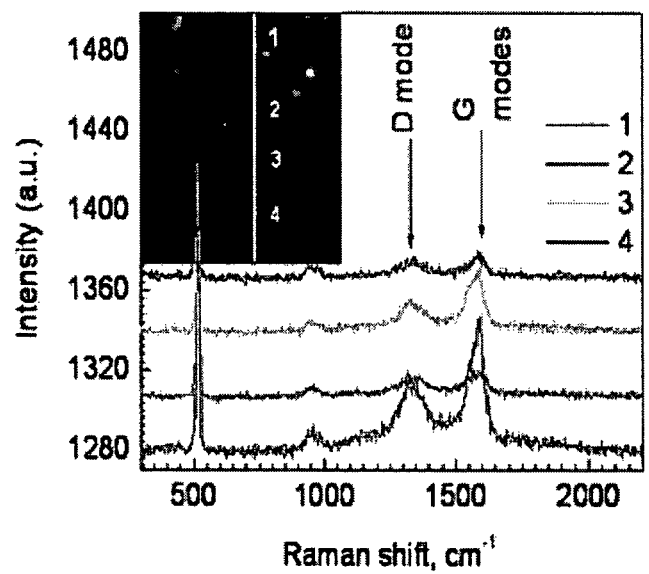
FIG. 15 is a Raman spectra of a channel area.

Effect of the number of prints on sheet resistance of a pattern comprising 1 cm2 SWCNT pads is shown in FIG. 13, where an increase in the number of prints results in a decrease in the sheet resistance. Gate dependence of SWCNT network channels having a width-to-length ratio of 200 mm:200 mm is shown in FIG. 14 for Vg ranging from −5V to 5V. FIG. 15 shows a Raman spectra of the channel area, with a 2D Raman map shown as an insert 98.

Figure 16:
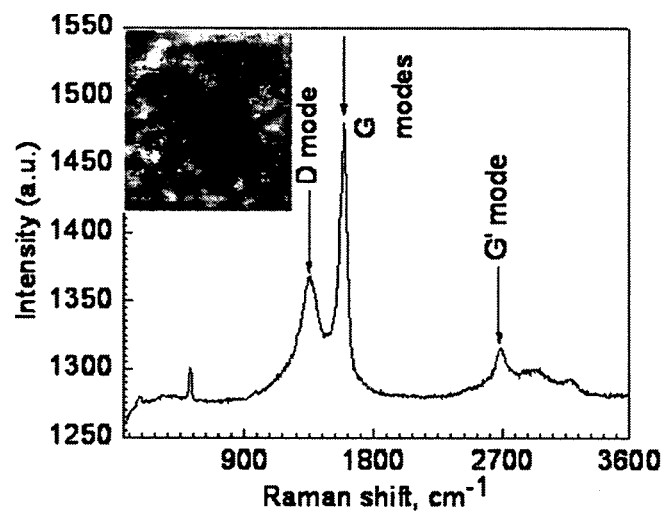
FIG. 16 is a Raman spectrum of an SWCNT pad.
Figure 17:
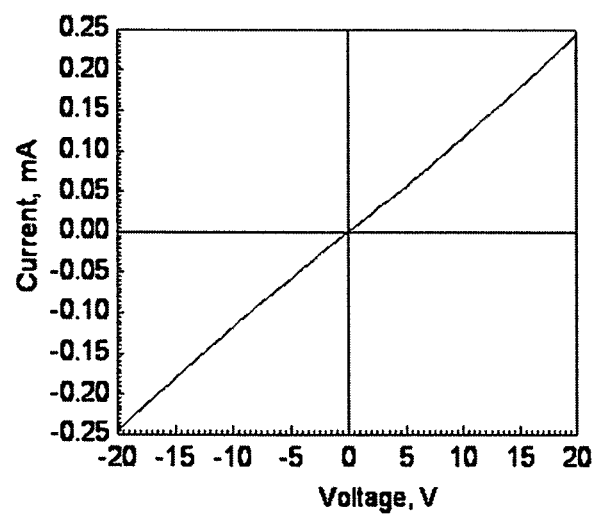
FIG. 17 is a an I-V curve of SWCNT pads.

Raman spectrum of a SWCNT pad is shown in FIG. 16, with a 2D Raman map shown as an insert 99. Placing two microprobes 1 mm apart on a printed SWCNT pad, Ohmic behaviour was observed as shown in the I-V curve of FIG. 17

Whilst there has been described in the foregoing description exemplary embodiments of the present invention, it will be understood by those skilled in the technology concerned that many variations in details of design, construction and/or operation may be made without departing from the present invention. For example, other than ink jet printing, other suitable forms of printing with an ink comprising nanostructures may be used, such as spray printing through a mask, screen printing or electrojet printing. The pattern of nanostructures printed may be a micropattern, or a microarray of patterns, or a scaled-up pattern as may be appropriate for various applications.

The invention claimed is:

1. A method of patterning nanostructures comprising:
   printing an ink comprising the nanostructures onto a solvent-extracting first surface such that a pattern of nanostructures is formed on the first surface,
   wherein the first surface is a patterned substrate selected from the group consisting of: a material having patterned conducting wires, a dielectric film embedded with conducting structures, a composite film, a composite material comprising dielectrics and conducting structures exposed by a process selected from the group consisting of: chemical-mechanical polishing and etching-back.

2. The method of claim 1, further comprising transfer printing the pattern of nanostructures from the first surface onto a second surface.

3. The method of claim 2, wherein the transfer printing comprises the steps of:
   (a) conformally contacting a stamp with the first surface such that the pattern of nanostructures on the first surface is transferred onto the stamp; and
   (b) conformally contacting the stamp with the second surface so that the pattern of nanostructures on the stamp is transferred onto the second surface.

4. The method of claim 3, wherein the stamp is a planar PDMS stamp.

5. The method of claim 2, wherein the first surface is a stamp and the transfer printing comprises conformally contacting the stamp with the second surface so that the pattern of nanostructures on the stamp is transferred onto the second surface.

6. The method of claim 5, wherein the stamp is a planar agarose stamp.

7. The method of claim 1, wherein the first surface is preferably at least one selected from the group consisting of: rigid, flexible, an alumina filter, a dielectric film, a conducting film, photo paper, agarose, a sol gel substrate, a silicon substrate, a PET substrate, and a PDMS substrate.

8. The method of claim 7, further comprising transfer printing the pattern of nanostructures from the first surface onto a second surface, wherein the second surface is preferably at least one selected from the group consisting of: rigid, flexible, a conducting film, a dielectric film, a PET substrate, a glass substrate, a silicon substrate, a quartz substrate, and a metal foil.

9. The method of claim 7, wherein the dielectric film is at least one selected from the group consisting of: solution processed, composite and organic.

10. The method of claim 2, wherein the second surface is a patterned substrate selected from the group consisting of: a material having patterned conducting wires, a dielectric film embedded with conducting structures, a composite film, a composite material comprising dielectrics and conducting structures exposed by a process selected from the group consisting of: chemical-mechanical polishing and etching-back.

11. The method of claim 1, wherein the nanostructures comprise at least one selected from the group consisting of: carbon nanotubes, metal nanoparticles, a metal oxide material, a semiconducting material, polymer particles, crystalline particles, amorphous particles, organic particles, inorganic particles, rods, fibres, needles, plates, whiskers, biological molecules, proteins, and biofunctionalized particles.

12. The method of claim 11, wherein the nanostructures are crystalline polymer particles for promoting self-alignment of the nanostructures.

13. The method of claim 1, wherein the nanostructures are modified for at least one purpose selected from the group consisting of: facilitating ink formulation and providing additional functionality.

14. The method of claim 1, wherein the ink comprises nanostructures homogenously dissolved in a solvent preferably being at least one selected from the group consisting of: single organic, multiple organic, polar, non-polar, and water.

15. The method of claim 1, wherein the ink further comprises additional material selected from the group consisting of: organic and inorganic.

16. The method of claim 15, wherein the additional material is removed from the pattern of nanostructures to obtain a pattern of pure nanostructures by a process preferably selected from the group consisting of: annealing, laser burning, and dissolving in a solvent.

17. The method of claim 1, wherein the ink has a form selected from the group consisting of: a suspension, a multiphase mixture, a micellar structure, a copolymer, and a colloid.

18. The method of claim 1, wherein the method is performed at a temperature ranging between 0° C. to 225° C., preferably between 30° C. to 225° C.

19. The method of claim 1, wherein the solvent-extracting first surface is at least one selected from the group consisting of: porous, absorbent and adsorbent.

20. The method of claim 1, wherein the solvent-extracting first surface has a sorptive capacity of at least 0.01 mL/g (intrinsic) and 0.1 mL/m2(extrinsic).

21. The method of claim 1, wherein the printing is selected from the group consisting of ink jet printing, spray printing through a mask, screen printing and electrojet printing.

22. A thin film transistor having an active layer, wherein the active layer comprises the pattern of nanostructures formed by the method of claim 1, and wherein the pattern of nanostructures is used for applications selected from but not limited to the group consisting of:
   interconnect applications having resistivity ranging from 10-10 Ω/cm to 1010 Ω/cm, supercapacitors, batteries, conducting electrodes and transparent electrodes.

* * * * *